(12) United States Patent
Sager

(10) Patent No.: US 7,045,205 B1
(45) Date of Patent: May 16, 2006

(54) DEVICE BASED ON COATED NANOPOROUS STRUCTURE

(75) Inventor: Brian M. Sager, Palo Alto, CA (US)

(73) Assignee: Nanosolar, Inc., Palo Alto, CA (US)

( * ) Notice: Subject to any disclaimer, the term of this patent is extended or adjusted under 35 U.S.C. 154(b) by 55 days.

(21) Appl. No.: 10/782,163

(22) Filed: Feb. 19, 2004

(51) Int. Cl.
B32B 3/26 (2006.01)
H01L 31/00 (2006.01)

(52) U.S. Cl. ............... 428/304.4; 428/307.7; 428/309.9; 428/312.6; 428/314.2; 428/315.7; 428/316.6; 428/318.4; 428/319.1; 428/446; 428/688; 257/40; 257/43; 257/462; 257/464; 257/465; 257/466; 136/263; 136/256; 136/257; 136/244

(58) Field of Classification Search ............ 428/304.4, 428/307.7, 309.9, 312.6, 314.2, 315.7, 316.6, 428/318.4, 319.1, 446, 688; 257/40, 43, 257/462, 464–466; 136/263, 256, 257, 244
See application file for complete search history.

(56) References Cited

U.S. PATENT DOCUMENTS

| | | |
|---|---|---|
| 5,482,570 A | 1/1996 | Saurer et al. ............... 136/255 |
| 5,525,440 A | 6/1996 | Kay et al. .................. 429/111 |
| 5,571,612 A | 11/1996 | Motohiro et al. ........... 428/323 |
| 5,674,325 A | 10/1997 | Albright et al. ............ 126/250 |
| 5,986,206 A | 11/1999 | Kambe et al. .............. 136/263 |
| 5,990,415 A | 11/1999 | Green et al. ................ 136/255 |
| 6,075,203 A | 6/2000 | Wang et al. ................. 136/256 |
| 6,270,846 B1 | 8/2001 | Brinker et al. ............ 427/385.5 |
| 6,278,056 B1 | 8/2001 | Sugihara et al. ........... 136/263 |
| 6,291,763 B1 | 9/2001 | Nakamura .................. 136/256 |
| 6,340,789 B1 | 1/2002 | Petritsch et al. ............ 136/263 |
| 6,852,920 B1 | 2/2005 | Sager et al. ................ 136/263 |

| | | |
|---|---|---|
| 2002/0017656 A1 | 2/2002 | Graetzel et al. ............ 257/184 |
| 2002/0134426 A1 | 9/2002 | Chiba et al. ................ 136/263 |
| 2002/0192441 A1 | 12/2002 | Kalkan et al. .............. 428/323 |
| 2003/0226498 A1 | 12/2003 | Alivisatos et al. ............ 117/84 |
| 2004/0084080 A1 | 5/2004 | Sager et al. ................ 136/263 |

(Continued)

FOREIGN PATENT DOCUMENTS

DE 2741954 3/1979

(Continued)

OTHER PUBLICATIONS

M.A. Cameron, et al. "Atomic layer Depositon of $SiO_2$ and $TiO_2$ in Alumina Tubular Membranes: Pore Reduction and Effect of Surface Species on Gas Transport" in *Langmuir 2000*, vol. 16, pp. 7435-7444, Published on web Jun. 10, 2000, American Chemical Society, Washington, DC.

(Continued)

*Primary Examiner*—Ling X. Xu
(74) *Attorney, Agent, or Firm*—JDI Patent; Joshua D. Isenberg

(57) ABSTRACT

A nanostructured apparatus may include a mesoporous template having an array of regularly-spaced pores. One or more layers of material may conformally coat the walls to a substantially uniform thickness. Such an apparatus can be used in a variety of devices including optoelectronic devices, e.g., light emitting devices (such as LEDs, and lasers) and photovoltaic devices (such as solar cells) optical devices (luminescent, electro-optic, and magnetooptic waveguides, optical filters, optical switches, amplifies, laser diodes, multiplexers, optical couplers, and the like), sensors, chemical devices (such as catalysts) and mechanical devices (such as filters for filtering gases or liquids).

31 Claims, 2 Drawing Sheets

U.S. PATENT DOCUMENTS

| | | | |
|---|---|---|---|
| 2004/0118448 A1 | 6/2004 | Scher et al. | 136/252 |
| 2004/0219730 A1 | 11/2004 | Basol | 438/200 |
| 2004/0250848 A1 | 12/2004 | Sager et al. | 136/263 |
| 2005/0045874 A1* | 3/2005 | Xiao et al. | 257/40 |
| 2005/0121068 A1 | 6/2005 | Sager et al. | 136/263 |

FOREIGN PATENT DOCUMENTS

| | | |
|---|---|---|
| EP | 1028475 A1 | 8/2000 |
| EP | 1087446 A2 | 3/2001 |

OTHER PUBLICATIONS

Gebeyehu, D., Brabec, C.J., Saricifti, N.S., Vangeneugden, D., Kiebooms, R., Vanderzande, D., Kienberger, F., and H. Schnindler. 2002. Hybrid Solar Cells based on dye-sensitized nanoporous $TiO_2$ electrodes and conjugated polymers as hole transport materials. Synthetic Metals 123, 279-287.

Hongyou Fan, Yunfeng Lu, Aaron Stump, Scott T. Reed, Tom Baer, Randy Schunk, Victor Perez-Luna, Gabriel P. Lopez & C. Jeffrey Brinker, "Rapid prototyping of patterned functional nanostructures", in *Nature* vol. 405, pp. 56-60, 2000.

M. Huang, et al. "Ag nanowire formation within mesoporous silica", in *Chemical Comminications*, 2000, pp. 1063-1064, Royal Society of Chemistry.

Alan Sellinger, Pilar M. Weiss, Anh Nguyen, Yunfeng Lu, Roger A. Assink, Weiliang Gong & C. Jeffrey Brinker. 1998. Continuous self-assembly of organic-inorganic nanocomposite coatings that mimic nacre. Nature 394, 256-260.

Yunfeng Lu, Rahul Ganguli, Celeste A. Drewien, Mark T. Anderson, C. Jeffrey Brinker, Weilang Gong, Yongxing Guo, Hermes Soyez, Bruce Dunn, Michael H. Huang & Jeffrey I. Zink. 1997. "Continuous formation of supported cubic and hexagonal mesoporous films by sol-gel dip-coating," Nature 389, Sep. 25, 1997.

L. Schmidt-Mende, A. Fechtenkotter, K. Mullen, E. Moons,R. H. Friend, J. D. MacKenzie. 2002. Self-Organized Discotic Liquid Crystals for High-Efficiency Organic Photovoltaics. Science 293, 1119-1122.

Wendy U. Huynh, Janke J. Dittmer, A. Paul Alivisatos. 2002. Hybrid Nanorod-PolymerSolar Cells. Science 295, 2425-2427.

Thuc-Quyen Nguyen, Junjun Wu, Vinh Doan, Benjamin J. Schwartz, Sarah H. Tolbert. "Control of Energy Transfer in Oriented Conjugated Polymer-Mesoporous Silica Composites" *Science* vol. 288, pp. 652-656, 2000.

P. Van Der Voort et al, A New Templated Ordered Structure with Combined Micro- and Mesopores and Internal Silica Nanocapsules, *J. Phys. Chem. B* 2002, 106, 5873-5877. Published on the web May 15, 2002.

M. Steinhart et al, "Polymer Nanotubes by Wetting of Order Porous Templates", *Science*, vol. 296, No. 14, Jun. 2002, p. 1997.

Huang Y, Duan, X, Wei, Q, & C.M. Lieber, "Directed Assembly Of One-Dimensional Nanostructures Into Functional Networks" *Science* 291(5504):630-633 (2001).

B. H Hong, et al., "Ultrathin Single-Crystalline Silver Nanowire Arrays Formed in an Ambient Solution Phase", *Science* 294: 348-351; Published online Sep. 6, 2001.

Justin D. Holmes, Keith P. Johnston, R. Christopher Doty, and Brian A. Korgel, "Control of Thickness and Orientation of Solution-Grown Silicon Nanowires" *Science* 2000 Feb. 25; 287: 1471-1473.

Y. Lu, et al., "Self-Assembly of Mesoscopically Ordered Chromatic Polydiacetylene Nanocomposites", *Nature* 410: 913-917 (2001.).

A. A. Gewirth, "Hot Topics in Electrodeposition—Scanning-Probe Microscopes in Electrodeposition", The Electrochemical Society Interface, Spring 1998, pp. 1-4.

U.S. Appl. No. 10/419,708 to Martin R. Roscheisen et al, filed Apr. 19, 2003 and entitled "Inter Facial Architecture for Nanostructured Optoelectronic Devices".

U.S. Appl. No. 10/719,041 to Brent J. Bollman et al, filed Nov. 21, 2003 and entitled "Solvent Vapor Infiltration of Organic Materials into Nanostructures".

* cited by examiner

US 7,045,205 B1

DEVICE BASED ON COATED NANOPOROUS STRUCTURE

FIELD OF THE INVENTION

This invention is directed to photovoltaic devices and more particularly to nanostructured photovoltaic devices and methods for manufacture of nanostructured photovoltaic devices.

BACKGROUND OF THE INVENTION

Many devices could benefit from an active layer having a network of regularly interconnected nanometer scale pores, including optoelectronic devices (e.g. photovoltaic cells, organic LEDs, and lasers), optical devices (e.g. waveguides and optical filters), mechanical devices (e.g. filters and separation media), and chemically-active devices (e.g. catalysts. In each of these and other device applications, it would be beneficial to have a nanometer-scale network comprised of either semiconducting (e.g. semiconducting metal oxides), conducting materials (e.g. metals), and/or sequentially placed conformal layers of semiconducting and conducting materials as a component of such devices.

Recently, mesoporous templates have been fabricated using sol gel surfactant temptation techniques. Examples of such surfactant-templation techniques for producing porous films are described, e.g., by Brinker, et al in U.S. Pat. No. 6,270,846, the disclosures of which are incorporated herein by reference. Such sol gel techniques can fabricate mesoporous metal oxide templates, which can be semiconducting. However, templates fabricated in this fashion often have an irregular pore structure with undulating channels as illustrated schematically in FIG. 1. The undulating channels make it difficult to incorporate material. Further, the types of metal oxides which can be formed using sol gel techniques are limited. In addition, conducting metal materials cannot be formed using sol gel techniques.

Sol gel techniques can fabricate silica templates with straight channels that intersect at right angles, as depicted schematically in FIG. 2. Unfortunately, silica is highly insulating and therefore not suitable as a semiconducting or conducting material. Furthermore, even the pore structure of FIG. 2 is difficult to fill or coat. Specifically, there is no satisfactory way to uniformly deposit material in both the horizontal pores as well as the vertical pores.

Thus, there is a need in the art, for a device containing regularly interconnected nanometer scale pores that are uniformly coated on their surface that overcomes the above difficulties and a corresponding method for making such a device.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the embodiments of the invention described below are set forth without any loss of generality to, and without imposing limitations upon, the claimed invention.

According to embodiments of the present invention, a device may include an active layer having a mesoporous template having an array of regularly spaced pores. An active material may be deposited on the walls of the pores in a way that conformally coats the walls to a substantially uniform thickness.

Figure 3:
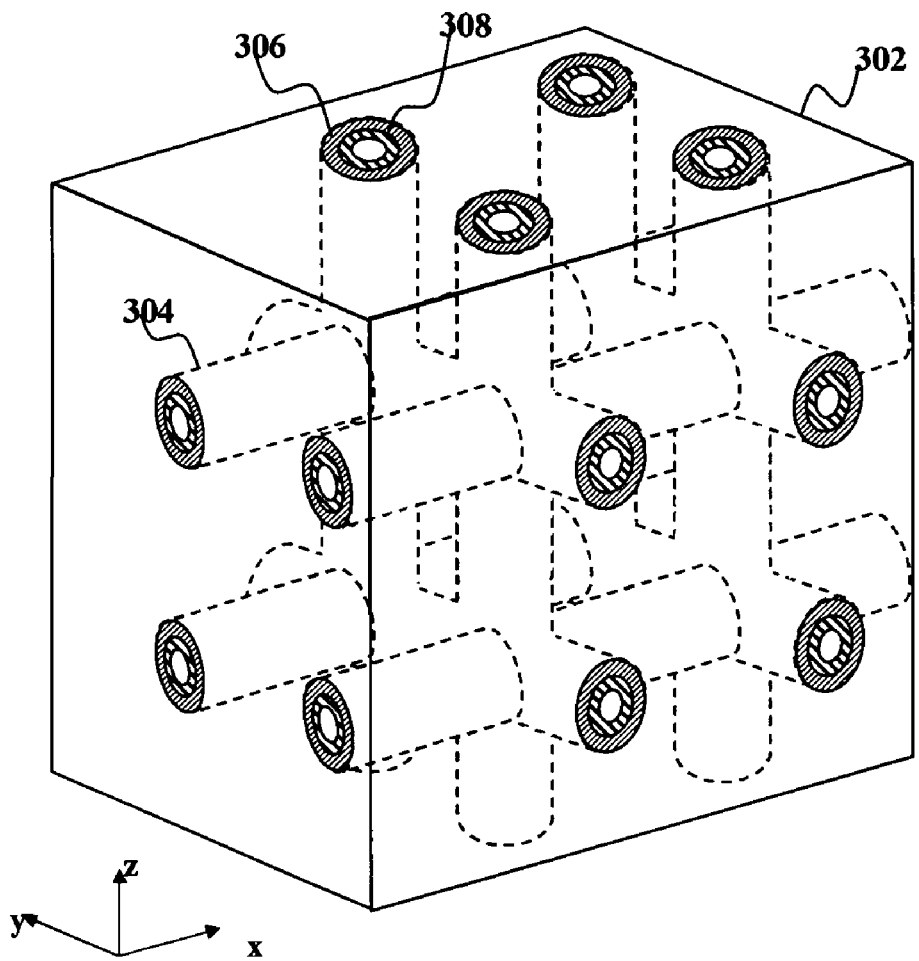
FIG. 3 is a schematic three-dimensional diagram of a portion of a nanostructured active layer according an embodiment of the present invention.

FIG. 3 depicts an example of a part of a nanostructured apparatus 300 according to an embodiment of the present invention. The apparatus 300 generally includes a mesoporous template 302 having a network of regularly spaced pores 304 (shown in phantom). One or more layers of materials 306, 308 coat the interior walls of the pores 304 in a substantially conformal fashion. The nature of the materials 306, 308 depends on the nature of the device in which the active layer 300 is used. For example, reactants and/or catalysts may participate in chemical reactions taking place within the pores 304. Alternatively, the materials 306, 308 may participate in physical reactions, such as light absorption, charge-splitting, light emission, charge transfer, charge storage, electrical or thermal conduction and the like, taking place within the pores 304.

Figure 1:
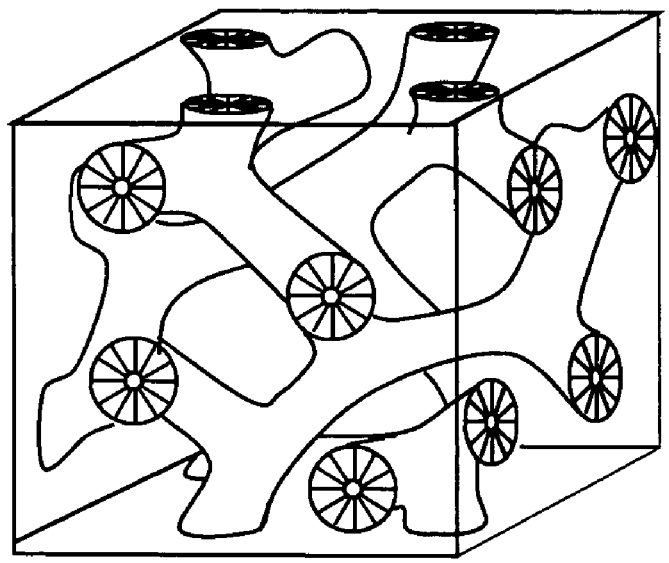
FIG. 1 is a schematic three-dimensional diagram of a first porous nanostructure according to the prior art.
Figure 2:
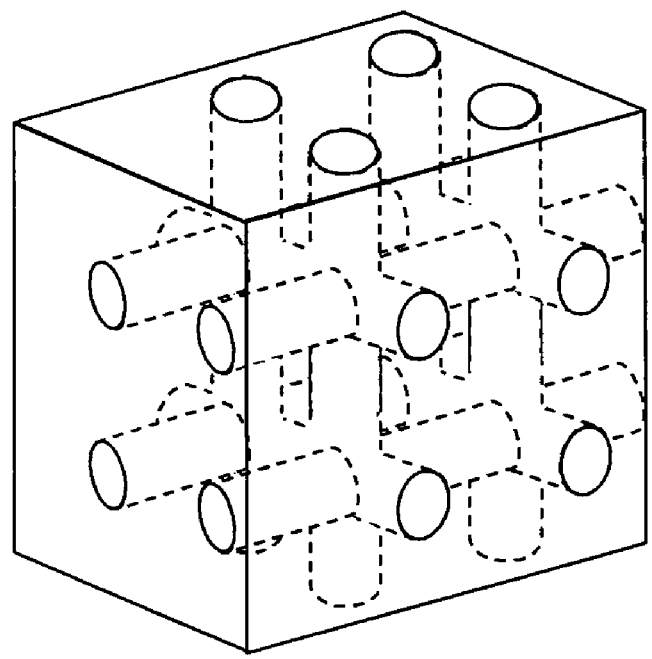
FIG. 2 is a schematic three-dimensional diagram of a first porous nanostructure according to the prior art.

A characteristic dimension of the pores 304 (e.g., pore diameter or center-to-center pore spacing) is between about 1 nm and 50 nm. In a preferred embodiment, the pores 304 are substantially straight in at least one direction. By way of example, the pores 304 may include one or more sets of substantially straight pores. Each set of pores may be aligned parallel to one of three substantially perpendicular axes x, y, z and may intersect as shown in FIG. 3. By way of example, the template 302 may be made of silica ($SiO_2$), with a porous structure of the type depicted in FIG. 2. Alternatively, the template may be made of a conducting or semiconducting material and may have a pore structure of the type shown in FIG. 1.

A silica-based structure, such as that depicted in FIG. 3, could serve as a three-dimensional template to construct a component for a variety of devices. For example, if the walls of the pores 304 were coated with a semiconducting metal oxide, the apparatus 300 could be used as the active layer of an optoelectronic device such as a solar cell if the layer(s) of material(s) 306, 308 include, e.g., a light-absorbing semiconducting material with differential electron affinity. In another example, materials 306, 308 include a non-reactive metal such as gold or silver or other non-reactive material, the apparatus 300 may provide a robust mechanical filter comprised of an inert surface that could remove particles above the template pore size from a liquid or gas media, and where the mechanical strength imparted by the metal coating may increase the pressure of the carrier medium (liquid or gas) that can be passed through the filter. In addition to gold or silver, other non-reactive metals that could be coated onto the structure include the heavier elements of Group VIIB in the periodic table (sometimes called the platinum metals). In such a case, it is desirable that these or similar materials 306, 308 do not completely fill up the pores 304.

In a third example, the materials 306, 308 may include a more reactive metal or other reactive material such as aluminum, magnesium, or calcium, such that the apparatus may act as a catalyst having a reactive surface that could increase the rate of a chemical reaction. In addition, such a structure could serve as both a filter and a catalyst. Furthermore, the materials 306, 308 may exhibit specific optical properties including but not limited to particular optical transmission, reflection, absorption or other properties. Thus, the apparatus 300 may act as optical devices such as luminescent, electro-optic, and magneto-optic waveguides, optical filters, optical switches, amplifies, laser diodes, multiplexers, optical couplers, and the like. Optical materials suitable for incorporation into optical devices include Nb-doped semiconductive SrTiO (NST), as well as (Pb,La)(Zr,Ti)O (PLZT), which has a higher electro-optic coefficient than LiNbO (Lithium Niobate), a widely used electro-optic material. Other suitable materials include BaTiO. More generally, the range of thin films suitable for such devices includes ferroelectrics, dielectrics, and glasses, with epitaxial or glass structures. Many of these materials can be readily deposited from metal organic precursors that are chemically compatible with ALD processes.

In addition the apparatus 300 may be used in sensors, e.g. chemical and biological sensors, where the layers 306, 308 include a semiconducting or conducting surface coating that can transmit electrical signals arising from binding of a chemical or biological molecule to the very high surface area of the nanoscale network of the mesoporous template 302. Such coatings could serve to transmit electronic information, e.g., in the form of charge arising from a detection event. Examples of suitable coatings include, but are not limited to, coatings that are electrically conductive (e.g. metallic) coatings, such as Copper, Platinum, and Silver.

By way of example and without limitation, the mesoporous template 302 may be made from a precursor sol by surfactant templation as described, e.g., in U.S. Pat. No. 6,270,846. The precursor sol may include one or more covalent metal complexes with a central element X, one or more surfactants, one or more condensation inhibitors, water, and a solvent. Generally speaking, the molar ratios of the surfactant, condensation inhibitor, ethanol and water may be in the following ranges with respect to the central element X:

[Surfactant]/[X]: a molar ratio ranging from about $1 \times 10^{-7}$ to about 0.1

[Solvent]/[X]: a molar ratio ranging from about 3 to about 50

[Condensation Inhibitor]/[X]: a molar ranging ratio from about $1 \times 10^{-5}$ to about 5

[water]/[X]: a molar ratio ranging from about 0 to about 20.

The central element X may be a metal, particularly a transition metal such as, e.g., Ag, Au, Cd, Co, Cr, Cu, Fe, Ir, Mn, Mo, Nb, Ni, Sr, Ta, Ti, V, W, Y, Zn, Zr, etc. Other suitable central elements X include Al, B, Ba, Ce, Ge, Hf, In, La, Pb, Os, Se, Si, Sn, Sr, or Va. The covalent metal complexes can be metal alkoxides and/or metal halides nitrides etc, including e.g., tetramethylorthosilicate, tetraethylorthosilicate, titanium butoxide, titanium iso-propoxide, zirconium n-butoxide, aluminum isopropoxide, aluminum iso-propoxide and mixtures thereof. In a preferred embodiment the central element X is silicon (Si) and the mesoporous template is made of $SiO_2$ (silica) For $SiO_2$-based surfactant templated films examples of suitable alkoxides include polysiloxanes such as tetraethylorthosilicate (TEOS). For $TiO_2$-based porous surfactant templated films examples of suitable covalent metal complexes include alkoxides such as titanium ethoxide or titanium isopropoxide, titanium chloride, titanium butoxide, titanium (AcAc) (i.e., titanium diisopropoxide(bis-2,4-pentanedionate)), titanium methacryloxyethylacetoacetate triisopropoxide, and titanium bis(triethanolamine) diisopropoxide and the like. The solvent can be a polar organic solvent or any other solvent that solubilizes the other reactants. Examples of suitable solvents include alcohols, (e.g., methanol, ethanol, propanol, butanol, isopropanol), tetrahydrofuran, formamide, dimethylformamide or mixtures thereof.

Examples of suitable surfactants include $HO(CH_2CH_2O)_n(CH_2CHCH_3O)_m(CH_2CH_2O)_nH$, where the subscripts m and n are integers. A particular surfactant of this type is the block copolymer poly(ethyleneoxide)-poly(propyleneoxide)-poly(ethyleneoxide) (sometimes known commercially as Pluronic P123), for which n=20, m=70, n=20. Alternatively, a triblock copolymer (sometimes known commercially as Pluronic F127) for which n=106, m=70, n=106 may be used. Other suitable surfactants include hexadecyl trimethylammonium bromide (CTAB), polyoxyalkylene ether, and poly(oxyethylene)cetyl ether (e.g., Brij56 or Brij58) Pluronic is a registered trademark of BASF Corporation of Ludwigshafen, Germany. Brij is a registered trademark of Atlas Chemicals of Wilmington Del. Brij 56 is polyoxyethylene 10 cetyl ether. Brij 58 has several synonyms, including poly(oxyethylene) cetyl ether, poly(oxyethylene) palmityl ether, polyethylene oxide hexadecyl ether, and polyethylene glycol cetyl ether.

Examples of suitable condensation inhibitors include acids such as hydrochloric acid (HCl), sulfuric acid ($H_2SO_4$), nitric acid ($HNO_3$), carboxylic acids, such as acetic acid (HOAc), and the like, bases such as sodium hydroxide (NaOH), ammonium hydroxide ($NH_4OH$) triethylamine, and the like, and chelating agents, such as ketones, B-diketones, carboxylic acids, B-keto-carboxylic acids, diols, aminoalcohols, crown ethers, hydroxyl or amine containing polymers, small molecules or cosolvents such as ethyl acetoacetate, 2-4-pentadione, acetone, diacetone alcohol, chatecol, stearic acid, lactic acid, chatechol, ethanolamine, triethanolamine and the like.

The sol may be filtered and a thin layer of the sol may be disposed on a substrate, e.g., by spin-coating, web-coating, dip-coating, spray-coating, ink-jet printing, doctor blade coating, spray coating, printing such as screen-printing, ink-jet printing, flexographic printing, gravure printing, micro-gravure printing, and the like. The solvent is evaporated from the sol to form a surfactant-templated film. Pore diameter and pore spacing in the surfactant templated film may be adjusted by (1) choice of surfactant, (2) concentration of surfactant, (3) the use of block co-polymers, (4) temperature, (5) humidity level, (6) deposition procedure and speed, (7) concentration of covalent metal complex, (8) use of cosolvents, (9) swelling agents, (10) chelating agents, (11) acids, or (12) bases, (13) the nature of the covalent metal complex, e.g., in terms of type and nature of ligands attached, or some combination of two or more of (1)–(13). Examples of these are described, e.g., in commonly assigned co-pending U.S. patent application Ser. No. 10/427,749, which is incorporated herein by reference.

The surfactant-templated film may be covalently crosslinked, e.g., by heating, to form the mesoporous template 302. During this step, the surfactant templates can be also be selectively removed, e.g., through exposure to heat.

For example, heating the as-coated film to between about 170° C. and about 400° C. is typically sufficient to covalently crosslink the mesoporous template and/or decompose the surfactant molecules while remaining within the thermal stability range of the underlying substrate. Incubation temperature, ramp rate and total incubation time may be varied to optimize the properties of the film.

Although the mesoporous template is described as being fabricated by surfactant templation, other techniques may be used. Examples of alternative techniques for forming the mesoporous template include, but are not limited to: (a) intercalation and/or grafting of organic or polymeric molecules within a mineral lamellar network; (b) synthesis by electrocrystallisation of hybrid molecular assemblies; (c) impregnation of preformed inorganic gels; (d) synthesis from heterofunctional metallic alkoxides metallic halides or silsesquioxannes; (e) synthesis of hybrid networks through the connection of well-defined functional nanobuilding blocks; (f) templated growth of inorganic or hybrid networks by using organic molecules, macromolecules, proteins or fibers as structure directing agents; and (g) templated growth using nanoparticles as structuring agents followed by removal of the nanoparticles.

After the mesoporous template 302 has been formed the active material 306, 308 may be deposited on the interior walls of the pores 304. By way of example, the active materials may be deposited by atomic layer deposition. Atomic Layer Deposition (ALD) is a high-quality thin-film deposition technique based on sequential, self-limiting surface reactions. In ALD a substrate is sequentially exposed to two or more reactant vapors while maintaining the substrate temperature within a temperature range favorable to the desired ALD reaction. A typical ALD process involves two sequential surface reactions involving two different reactants referred to herein as A and B. The ALD system may be purged of reactant gas between the A and B reactions with a non-reactive purge gas. The AB reaction sequence forms a very thin layer of material, e.g., as little as one atomic layer, or a partial atomic monolayer, on the walls of the pores 304.

Films deposited by ALD tend to be uniform over large areas. In addition ALD allows deposition of conformal films on structures having very high aspect ratios (e.g., >100). So long as the spaces to be coated, e.g., gaps or pores, are larger than the ALD reactant gas molecules, the reactant gases can diffuse into the spaces. A wide variety of materials may be deposited by ALD, including semiconductors, metals, oxides, nitrides, and other materials. ALD techniques can thus deposit thin films one atomic layer at a time, in a "digital" fashion. The thickness of the ALD deposited film depends on the number of repetitions of the A/B deposition reaction sequence. Such "digital" build-up of material simplifies thickness control, thus reducing both complexity and cost. Another advantage of ALD is that it may be carried out at temperatures as low as room temperature.

By way of example, the layers of material 306, 308 may include a layer of titania ($TiO_2$). Other suitable semiconducting materials include any of several metal oxides, e.g., zinc oxide, zirconium oxide, hafnium oxide, and the like. By way of example, where reactant A may be $TiCl_4$ and reactant B may be water vapor ($H_2O$), the two half-reactions may deposit a layer of $TiO_2$. Atomic layer deposition using these reactants is described, e.g., by M. A. Cameron, et al., in "Atomic Layer Deposition of $SiO_2$ and $TiO_2$ in Alumina Tubular Membranes: Pore Reduction and Effect of Surface Species on Gas Transport," Langmuir 2000, 16, 7425–7444, American Chemical Society, Washington D.C., which is incorporated herein by reference. In addition to oxides, layers of metals and other materials may also be deposited by ALD.

Additional layers of materials may be deposited on the walls of the pores 304 in subsequent processing steps (e.g., additional ALD or other deposition steps). It is also possible to completely or nearly completely fill the pores in the template 302 with additional material, e.g., by ALD, electrodeposition, electroless (chemical bath) deposition, or other techniques. By way of example, and without loss of generality, the pores 304 may be coated or filled with organic materials (e.g., a polymers, fullerenes, pigments, dyes, or small molecules) at room temperature by exposing the polymer to solvent vapor while on or mixed with the mesoporous template 302. Solvent vapor infiltration techniques are described, e.g., in U.S. patent application Ser. No. 10/719,041, which is incorporated herein by reference.

The nanostructured apparatus 300 may provide a three-dimensional layer having a network of regularly interconnected nanometer scale pores useful as a component for several different types of devices including optoelectronic devices (e.g. photovoltaic cells, light emitting devices, e.g., organic light-emitting diodes (LEDs), and lasers), optical devices (e.g. luminescent, electro-optic, and magneto-optic waveguides, optical filters, optical switches, amplifies, laser diodes, multiplexers, optical couplers, and the like), mechanical devices (e.g. filters and separation media), and chemically-active devices (e.g. catalysts).

Figure 4:
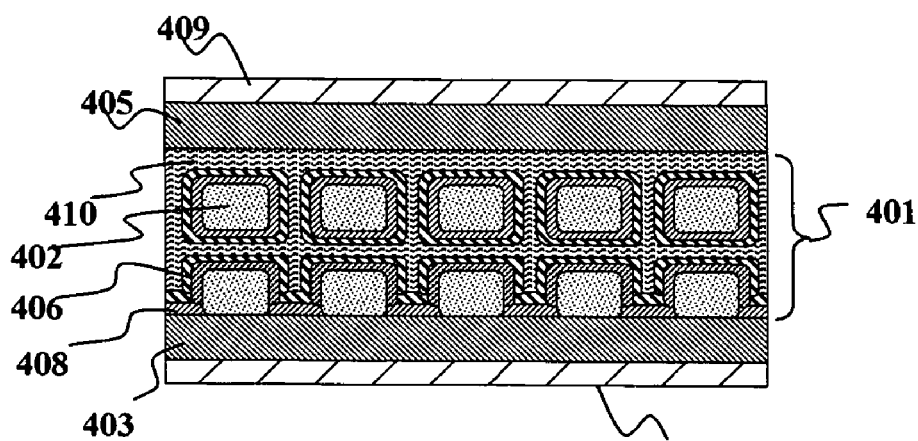
FIG. 4 is a vertical cross-sectional schematic diagram illustrating a photovoltaic device according to an embodiment of the present invention.

By way of example, FIG. 4 depicts an optoelectronic device 400 having an active layer 401 with a mesoporous template 402 of the type described above may be disposed between first and second electrodes 403, 405 (one of which may be transparent). For optoelectronic devices, it is often extremely desirable that the template 402 be made of an optically transparent or translucent material. Optional encapsulant layers 407, 409, e.g., glass or Mylar may protect the device 400. A first semiconductor material 406 coats the interiors of pores in the template 402, e.g., to a thickness of about 10 nm to about 30 nm. An (optional) second semiconducting material 408 may coat the first, e.g., if the template 402 is made of an insulating material, such as silica. In such a case, the first semiconductor material 406 may make electrical contact with the first electrode 403. The nanostructuring of the template 402 provides a large area interface between the semiconductor materials 406, 408 or between the first semiconductor material 406 and the template 402.

The choice of semiconductor materials depends, in part, on the nature of the optoelectronic device. For example, the semiconductor materials 406, 408 may be chosen so that the device 400 acts as a light-emitting device such as an LED or laser. For example, the device 400 may be configured as an LED if the materials 406, 408 are doped such that they act as a PN junction that gives off light when biased in the forward direction. An LED-type device may be configured as a semiconductor laser, e.g., by suitable doping and/or reflecting surfaces configured to provide a resonant cavity for the emitted light to promote stimulated emission. Furthermore, the device 400 may be configured as a photovoltaic device if the materials 406, 408 have complementary charge transfer properties with respect to each other (e.g., different affinity levels) and at least one of the two semiconductor materials 406, 408 absorbs light.

By way of example, for photovoltaic devices and LEDs, the first and second semiconductor materials 406, 408 may include inorganic materials, such as titania (titanium oxide, $TiO_2$), zinc oxide (ZnO), zirconium oxide, lanthanum oxide, niobium oxide, tungsten oxide, tin oxide, copper oxide, strontium oxide, calcium/titanium oxide, indium oxide, tungsten oxide, vanadium oxide, zirconium oxide, molybdenum oxide, vanadium oxide, strontium oxide, sodium titanate, potassium niobate, silicon (e.g., p-type or n-type doped), cadmium selenide (CdSe), cadmium suflide (CdS), cadmium telluride (CdTe), cadmium telluride selenide (CdTeSe), cadmium indium diselenide ($CdInSe_2$, CIS), cadmium indium Gallium diselenide ($CdInGASe_2$, CIGS) as well as blends or alloys of two or more such materials.

The second semiconductor material 408 may be inorganic or organic. Examples of suitable organic materials for photovoltaic devices include conjugated polymers such as poly (phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene) (PPV)), PPV copolymers, poly(thiophene) and derivatives thereof (e.g., poly(3-octylthiophene-2,5,-diyl), regioregular, poly(3-octylthiophene-2,5,-diyl) regioregular poly(3-hexylthiophene-2,5-diyl) (P3HT), regiorandom, poly(3-hexylthiophene-2,5-diyl)), poly(thienylenevinylene) and derivatives thereof, and poly(isothianaphthene) and derivatives thereof. Other suitable polymers include organometallic polymers, polymers containing perylene units, poly(squaraines) and their derivatives, and discotic liquid crystals. Other suitable organic materials include organic pigments or dyes, azo-dyes having azo chromofores (—N═N—) linking aromatic groups, phthalocyanines including metal-free phthalocyanine; (HPc), Cu phthalocyanine (CuPc), Zinc phthalocyanine (ZnPc), perylenes, naphthalocyanines, squaraines, merocyanines and their respective derivatives, poly(silanes), poly (germinates), 2,9-Di(pent-3-yl)-anthra[2,1,9-def:6,5,10-d'e'f']diisoquinoline-1,3,8,10-tetrone, and 2,9-Bis-(1-hexylhept-1-yl)-anthra[2,1,9-def:6,5,10-d'e'f']diisoquinoline-1,3, 8,10-tetrone and small organic molecules such as pentacene and/or pentacene precursors. Blends of two or more of these materials can be combined as well.

In photovoltaic device embodiments where the template 402 is itself made from a semiconducting material, it is desirable for the template 402 and first semiconducting material 406 to have complementary charge transfer properties with respect to each other (e.g., titania and copper oxide). In other embodiments, it may be desirable to solution coat the template 402 (if semiconducting) or first semiconductor material 406 with an interfacial layer of, e.g., a ruthenium dye or functionalized fullerene (e.g., $C_{60}$). The use of interfacial layers in optoelectronic devices is described e.g., in commonly assigned U.S. patent application Ser. No. 10/419,708, which is incorporated herein by reference.

In some embodiments, it may be desirable to (optionally) coat or fill portions the template 402 with a conductive material 410, which may be either organic or inorganic. The conductive material may cover a portion of a surface of the active layer to enhance electrical contact between one of the semiconductor materials (406, 408) and one of the electrodes (403, 405). By way of example, the conductive material 410 may be a transparent conductive polymer material (e.g., PEDOT, PEDOT or polyaniline doped with a dopant such as polystyrene sulfonic acid (PSS). Alternatively, the conductive material may be a transparent conductive oxide, e.g., indium tin oxide (ITO), fluorinated tin oxide ($F:SnO_2$) and the like.

Embodiments of the present invention provide for fabrication of a highly ordered three-dimensional mesoporous template that may be uniformly coated with a variety of different materials that cannot be otherwise self-assembled into such an ordered form. Consequently, highly efficient optoelectronic devices, e.g., light emitting devices (such as, organic LEDs, and lasers), photovoltaic devices (such as solar cells), optical devices (luminescent, electro-optic, and magneto-optic waveguides, optical filters, optical switches, amplifies, laser diodes, multiplexers, optical couplers, and the like), chemical devices (such as catalysts) and mechanical devices (such as filters for filtering gases or liquids) may be fabricated efficiently and economically.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function or step-plus function limitations, unless such a limitation is explicitly recited in a given claim using the phrase "means for" or "step for."

What is claimed is:

1. A nanostructured apparatus, comprising:
   a mesoporous template having a network of regularly-spaced intersecting pores, wherein a characteristic dimension of the pores is between about 1 nm and about 100 nm; and
   a layer of material that substantially coats one or more walls of the pores to a substantially uniform thickness.

2. The apparatus of claim 1 wherein the pores include one or more sets of substantially straight and parallel pores.

3. The apparatus of claim 2 wherein the pores include first and second sets of substantially straight and parallel intersecting pores, wherein the pores in the first set run substantially perpendicular to the pores in the second set.

4. The apparatus of claim 3 wherein the layer of material coats the walls of the pores in both sets in a substantially uniform fashion.

5. The apparatus of claim 3 further comprising a third set of substantially straight and parallel pores that intersect the pores in the first and/or second sets, wherein the pores in the third set run substantially perpendicular to the pores in the first and second sets.

6. The apparatus of claim 5 wherein the layer of material coats the walls of the pores in all three sets in a substantially uniform fashion.

7. The apparatus of claim 1 wherein the material is a first semiconductor material.

8. The apparatus of claim 7, further comprising a second semiconductor material disposed within one or more of the pores, wherein the first and second semiconductor materials have complementary charge transfer properties.

9. The apparatus of claim 1, wherein the mesoporous template is made from an insulating material.

10. The apparatus of claim 9 wherein the insulating material is silica ($SiO_2$).

11. The apparatus of claim 1 wherein the mesoporous template is made from a semiconducting material.

12. The apparatus of claim 1 wherein the layer of material includes one or more reactant materials, catalyst materials, light absorbing materials or semiconducting materials.

13. The apparatus of claim 12 wherein the layer of material includes a first semiconducting material.

14. The apparatus of claim 13 further comprising a second semiconductor material disposed on the first semiconductor material, wherein the first and second semiconductor materials have complementary charge transfer properties.

15. The apparatus of claim 14 wherein at least one of the first and second semiconductor materials is a light absorbing material.

16. The apparatus of claim 14 wherein one of the first and second semiconductor materials is an organic material.

17. The apparatus of claim 1 wherein the layer of material has been deposited by atomic layer deposition.

18. The apparatus of claim 1 wherein the layer of material includes a light-absorbing semiconductor material.

19. The apparatus of claim 1 wherein the layer of material includes a non-reactive metal or metal oxide, that provides an inert surface whereby that apparatus may act as a filter.

20. The apparatus of claim 1 wherein the layer of material includes a reactive metal or metal oxide that provides a reactive surface whereby the apparatus may act as a catalyst and/or filter.

21. The apparatus of claim 1 wherein the layer material has optical transmission, reflection, absorption or other properties whereby the apparatus may act as an optical device.

22. The apparatus of claim 21 wherein the optical device is a luminescent, electro-optic, and magneto-optic waveguides, optical filters, optical switches, amplifies, laser diodes, multiplexers, optical couplers.

23. The apparatus of claim 1 wherein the layer of material includes a semiconducting or conducting surface coating that can transmit electrical signals arising from binding of a molecule to the surface coating, whereby the apparatus is a sensor.

24. An optoelectronic device, comprising:
an active layer disposed between a first electrode and a second electrode, wherein the active layer includes a mesoporous template having a network of regularly-spaced intersecting pores, wherein a characteristic dimension of the pores is between about 1 nm and about 100 nm; and one or more semiconducting materials that substantially coat one or more interior walls of the pores to a substantially uniform thickness.

25. The device of claim 24 wherein the mesoporous template is made of silica.

26. The device of claim 25 wherein the first semiconducting material has been deposited by atomic layer deposition.

27. The device of claim 26, wherein the one or more semiconducting materials include a first semiconducting material and a second semiconducting material, wherein the first and second semiconducting materials have complementary charge transfer properties.

28. The device of claim 24 wherein the semiconducting material is configured such that the device is an LED, laser, or photovoltaic device.

29. A method for making a nanostructured apparatus, comprising:
forming a mesoporous template having a network of regularly-spaced intersecting pores, wherein a characteristic dimension of the pores is between about 1 nm and about 100 nm; and
substantially coating one or more walls of the pores with a layer of material to a substantially uniform thickness.

30. The method of claim 29 wherein forming a mesoporous template includes disposing a sol on a substrate, wherein the sol includes one or more alkoxides with a central element X, one or more surfactants, one or more condensation inhibitors, water, and a solvent,
evaporating the solvent from the sol to form a surfactant-templated porous film, and
crosslinking the surfactant-templated porous film to form mesoporous template.

31. The method of claim 29 wherein coating one or more walls of the pores with a layer of material includes depositing the layer of material by atomic layer deposition.

* * * * *